United States Patent
Gardner et al.

[19]

[11] Patent Number: 5,898,189
[45] Date of Patent: Apr. 27, 1999

[54] INTEGRATED CIRCUIT INCLUDING AN OXIDE-ISOLATED LOCALIZED SUBSTRATE AND A STANDARD SILICON SUBSTRATE AND FABRICATION METHOD

[75] Inventors: Mark I. Gardner, Cedar Creek; Daniel Kadosh; Michael Duane, both of Austin, all of Tex.

[73] Assignee: Advanced Micro Devices, Inc., Sunnyvale, Calif.

[21] Appl. No.: 08/905,614

[22] Filed: Aug. 4, 1997

[51] Int. Cl.$^6$ .......................... H01L 29/76; H01L 29/04; H01L 21/263
[52] U.S. Cl. .......................... 257/661; 257/74; 257/350; 257/351; 438/152
[58] Field of Search .................. 257/67, 69, 70, 257/74, 347, 348, 349, 350, 351, 353; 438/152, 153, 155, 164, 480, 481

[56] References Cited

U.S. PATENT DOCUMENTS

| | | | |
|---|---|---|---|
| 4,498,226 | 2/1985 | Inoue et al. | 438/152 |
| 4,939,568 | 7/1990 | Kato et al. | |
| 5,391,894 | 2/1995 | Itabashi et al. | 257/67 |
| 5,426,072 | 6/1995 | Finnila. | |
| 5,612,552 | 3/1997 | Owens | 257/202 |

FOREIGN PATENT DOCUMENTS

| | | | |
|---|---|---|---|
| 58-43554 | 3/1983 | Japan. | |
| 362145850 | 6/1987 | Japan | 257/74 |
| 63-211672 | 9/1988 | Japan. | |
| 402109359 | 4/1990 | Japan | 257/67 |
| 404360570 | 12/1992 | Japan | 257/67 |

*Primary Examiner*—Tom Thomas
*Assistant Examiner*—Ori Nadav
*Attorney, Agent, or Firm*—Skjerven, Morrill, MacPherson, Franklin & Friel LLP; Ken J. Koestner

[57] ABSTRACT

A multi-dimensional transistor structure is fabricated which includes a base transistor substrate upon which transistors are formed. An elevated substrate is formed overlying the base transistor and having an oxide isolation formed in localized regions beneath the elevated substrate but overlying the base transistor substrate. A plurality of transistors are formed on a substrate wafer to form a base-level transistor formation. An intralevel dielectric (ILD) layer is deposited overlying the base-level transistor formation. Overlying the ILD layer, a "sandwich" structure is formed with the deposition of a first polysilicon layer, deposition of an oxide isolation layer, and deposition of a second polysilicon layer. The median oxide isolation layer is patterned and etched according to a localized oxide isolation mask in a configuration determined by the position of transistors in the base-level transistor formation and by the planned position of transistors, that are not yet formed, in an overlying elevated substrate level. The median oxide isolation layer is patterned and etched in a configuration so that isolation is achieved in a predetermined manner, for example, on an individual transistor basis, a transistor group basis, or the like. The resulting electronic integrated circuit structure is used for high speed circuit applications due to high packing densities and small distances between devices.

21 Claims, 7 Drawing Sheets

INTEGRATED CIRCUIT INCLUDING AN OXIDE-ISOLATED LOCALIZED SUBSTRATE AND A STANDARD SILICON SUBSTRATE AND FABRICATION METHOD

BACKGROUND OF THE INVENTION

1. Field of the Invention

The present invention relates to an integrated circuit and fabrication method. More specifically, the present invention relates to an integrated circuit including transistors formed in a plurality of planes on substrates including an oxide-isolated substrate and a silicon substrate.

2. Description of the Related Art

In the past several decades, the semiconductor industry has continuously developed new and improved fabrication processes. Process improvements, including process improvements and structural improvements, have generated more highly integrated and reliable circuits. Manufacturing process improvements and economies of scale resulting in reduced costs and prices have combined to result in fabrication of devices and circuits in increasingly high densities, quantities, and reliability. Structural improvements include new device designs that improve circuit performance, power control, and reliability.

Technological advancements from small-scale integration (SSI) to ultralarge-scale integration (ULSI) are accompanied by a trend to increasing integrated circuit chip size and decreasing size of individual circuit components. Although integrated circuit chip size has grown as increasing numbers of devices are constructed on the chip, higher densities more greatly result from a decrease in the size of each part of the individual devices, known as the device feature size. The decrease in feature size has resulted from technological improvements in photolithography imaging processes and a trend toward fabrication of multiple layers of conductors.

Recently, the improvements in photolithography have slowed due to limitations in the imaging process, which are exacerbated by increased surface steps, additional layers, and increases in wafer diameter.

What is needed is a semiconductor processing technique and integrated circuit structural design that allows for increased improvement in integrated circuit density.

SUMMARY

A semiconductor fabrication technique has been discovered for fabricating transistors on an elevated plane, resulting in an improved integrated circuit density and an accelerated operating speed for high speed circuit applications. The semiconductor fabrication technique utilizes formation of oxide isolation in localized regions beneath an elevated substrate. Transistors formed in the elevated substrate have enhanced transistor performance and properties resulting from the oxide isolation between transistors and transistor elevations.

In accordance with one aspect of the present invention, a multi-dimensional transistor structure is fabricated which includes a base transistor substrate upon which transistors are formed. An elevated substrate is formed overlying the base transistor and having an oxide isolation formed in localized regions beneath the elevated substrate but overlying the base transistor substrate.

In accordance with an embodiment of the present invention, a plurality of transistors are formed on a substrate wafer to form a base-level transistor formation. An intralevel dielectric (ILD) layer is deposited overlying the base-level transistor formation. Overlying the ILD layer, a "sandwich" structure is formed with the deposition of a first polysilicon layer, deposition of an oxide isolation layer, and deposition of a second polysilicon layer. The median oxide isolation layer is patterned and etched according to a localized oxide isolation mask in a configuration determined by the position of transistors in the base-level transistor formation and by the planned position of transistors, that are not yet formed, in an overlying elevated substrate level. The median oxide isolation layer is patterned and etched in a configuration so that isolation is achieved in a predetermined manner, for example, on an individual transistor basis, a transistor group basis, or the like. The resulting electronic integrated circuit structure is highly advantageous for high speed circuit applications due to high packing densities and small distances between devices.

The localized oxide isolation mask has a configuration that is determined not only by the position of the transistors but also other characteristics of the transistors and properties of the circuit that is fabricated. In some embodiments, two different types of transistors are fabricated. One type of transistor is formed on a transistor level such as the base transistor level. A second type of transistor is formed on an elevated level with respect to the base transistor level and the localized oxide isolation mask is patterned to isolate the two types of transistors. Localized oxide isolation advantageously achieves very robust reliability properties so that, if desired, a transistor can be essentially completely isolated from other transistors by the deposited oxide layer. The oxide isolation layer is formed to a thickness from approximately 500 Å to approximately 4000 Å to achieve virtually complete isolation between transistors.

In accordance with an aspect of the present invention, multiple-layer fabrication of transistors achieves low power consumption and high packing density. Speed losses that occur in conventional circuits result from the multiple sequences of contacts that must be traversed to complete a circuit connection. The present structure and fabrication method yields integrated circuits with a much higher packing density than conventional integrated circuits so that the close proximity of transistors, located in elevated planes, results in faster signaling between transistors and higher speed circuit communication. Ideally, transistors can be directly connected using the described fabrication method to achieve the described structure so that theoretically a zero propagation loss occurs between transistors.

In accordance with an embodiment of the present invention, a method of fabricating an integrated circuit includes forming a transistor on a substrate, forming an intralayer dielectric (LLD) layer overlying the substrate and the transistor, and depositing a first-elevated-level polysilicon layer overlying the ILD layer. The method further includes depositing an oxide isolation layer overlying the first-elevated-level polysilicon layer, and depositing a second-elevated-level polysilicon layer overlying the oxide isolation layer. The second-elevated-level polysilicon layer and the oxide isolation layer are patterned and etched using an oxide isolated localized substrate mask to expose a portion of the first-elevated-level polysilicon layer at a first elevated level leaving a remaining portion of the first-elevated-level polysilicon layer underlying a remaining portion of the oxide isolation layer and a remaining portion of the second-elevated-level polysilicon layer exposed at a second elevated level. A transistor is formed on an elevated level of the first and second elevated levels.

Many advantages are gained by the described integrated circuit and corresponding fabrication method. The described integrated circuit and fabrication method advantageously attain a very fast data transfer rate for quickly passing a signal through a circuit, reducing the circuit transit time of electrons. Many benefits are attained through a reduction in feature size and an attendant increase in integrated circuit density. An increased density integrated circuit achieves an increase in circuit speed. An increased circuit density results in a reduced travel distance for charge carriers since individual devices occupy less space. As a result, information is transferred to and from devices in the circuit in less time. An increased-density integrated circuit advantageously operates with a reduced power consumption.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE ILLUSTRATIVE EMBODIMENTS

Figure 1A:
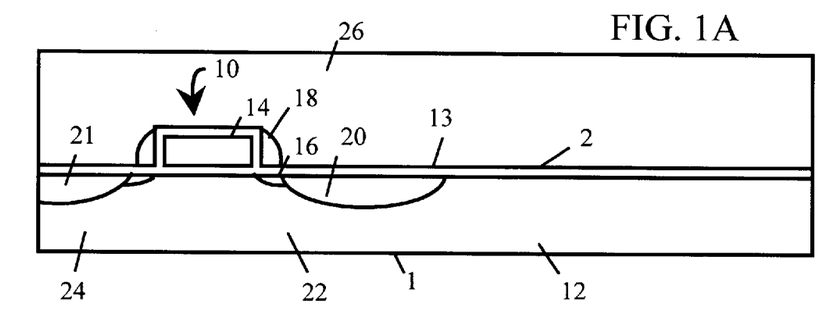
FIGS. 1A through 1D depict a sequence of schematic cross-sectional views that portray a summary of an embodiment of a fabrication process for forming an integrated circuit including transistors formed in a plurality of planes on substrates including an oxide-isolated substrate and a silicon substrate in accordance with an aspect of the present invention.

FIG. 1A depicts a portion of a semiconductor wafer 1 showing a cross-sectional view of a MOSFET 10 formed on a transistor layer 2 of a substrate 12. In an illustrative embodiment, the MOSFET 10 is formed using lightly-doped drain (LDD) fabrication techniques including formation of a gate oxide layer 13 overlying the substrate 12, formation of a polysilicon gate 14, and implant of LDD regions 16 in the substrate 12 self-aligned with the polysilicon gate 14. Silicon nitride or silicon dioxide spacers 18 are formed lateral to the polysilicon gate 14.

In other embodiments, to achieve fast data communications the gate electrodes could be other materials like metal. Alternatively, the gate is formed of polysilicon which is deposited by low pressure chemical vapor deposition (LPCVD). The polysilicon could also be a sputtered film.

Following formation of the spacers 18, a heavily-doped drain implant 20 is implanted on a drain side 22 of the MOSFET 120. A source side 24 of the MOSFET 10 may be implanted with a heavily-doped source implant 21. An intralayer dielectric (ILD) layer of silicon dioxide 26 is deposited over the substrate 12 and the polysilicon gate 14 and spacers 18 to electrically isolate devices formed on the substrate 12. The ILD layer of silicon dioxide 26 is deposited in a thick layer, for example in a range from approximately 1000 Å to about 25000 Å and planarized. The ILD layer of silicon dioxide 26 mutually isolates devices on the surface of the substrate 12 and isolates the devices from overlying conductive layers that are subsequently formed.

Figure 1B:
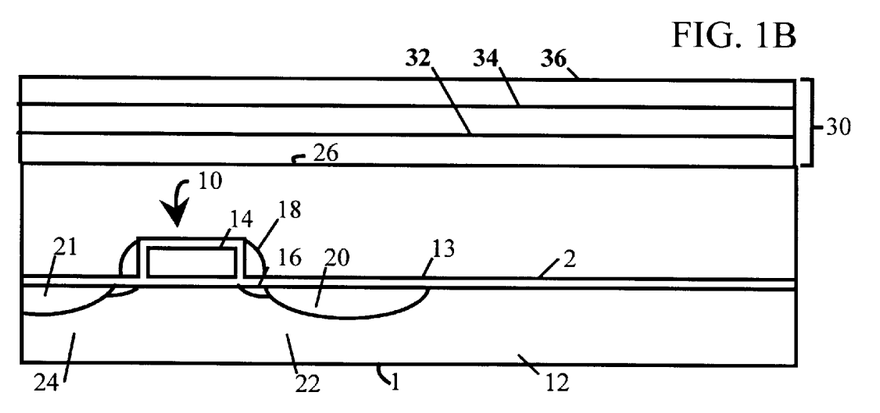

A multiple-layer integrated circuit is designed and specified to include a selected substrate thickness between adjacent layers of the multiple transistor layers. The multiple-layer integrated circuit is further specified to include a selected depth of polysilicon for forming an elevated transistor level. Referring to FIG. 1B, an elevated transistor substrate "sandwich" 30 is formed overlying the ILD layer of silicon dioxide 26. The transistor substrate sandwich 30 is formed by first depositing a base polysilicon layer 32 directly overlying the intralayer dielectric (ILD) layer of silicon dioxide 26 over the entire surface of the semiconductor wafer 1. A silicon dioxide ($SiO_2$) isolation layer 34 is deposited overlying the base polysilicon layer 32. A top polysilicon layer 36 is deposited overlying the $SiO_2$ isolation layer 34.

The base polysilicon layer 32 is typically deposited to a thickness in a range from approximately 500 Å to approximately 4000 Å. The $SiO_2$ isolation layer 34 is deposited overlying the base polysilicon layer 32 to a thickness of approximately 500 Å to approximately 2000 Å The top polysilicon layer 36 is deposited overlying the $SiO_2$ isolation layer 34 to a thickness in a range from approximately 500 Å to approximately 4000 Å.

The thickness of the constituent layers of the transistor substrate sandwich 30 is predetermined based on a desired depth of junctions formed on the elevated substrate. Most junctions are less than one micron in depth so that a typical range of depths for the transistor substrate sandwich 30 is in a range from 1 to 3 microns. However, in some embodiments, the thickness of the transistor substrate sandwich 30 may be substantially reduced by doping the substrate completely through the layer. Dopant is allowed to diffuse completely through the top polysilicon layer 36 since the $SiO_2$ isolation layer 34 is formed at the base of the top polysilicon layer 36 to supply isolation. The thickness of the top polysilicon layer 36 when doped throughout the layer may be reduced to a 500 Å or less although thickness in a range from approximately 300 Å to about 500 Å are typical.

The base polysilicon layer 32 may similarly be reduced in thickness by highly doping through the layer to provide doping isolation rather than oxide isolation. Isolation between transistors on a level may be formed by removing segments of the substrate by etching, deposition of silicon dioxide ($SiO_2$) in the removed segments, and polishing of the $SiO_2$ so that the transistors are mutually isolated.

Figure 1C:
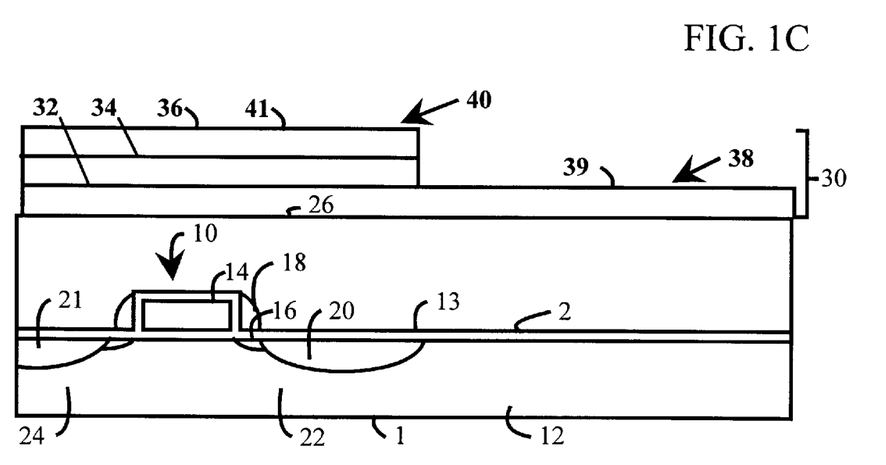

Referring to FIG. 1C, a localized oxide isolation mask (not shown) is applied to the surface of the top polysilicon layer 36 to pattern the $SiO_2$ isolation layer 34 and the top polysilicon layer 36, leaving a first elevated substrate region 38 and a second elevated substrate region 40. The first elevated substrate region 38 has a top surface 39 formed by the base polysilicon layer 32. The second elevated substrate region 40 has a top surface 41 formed by the top polysilicon layer 36. The $SiO_2$ isolation layer 34 between the polysilicon layers 32 and 36 supplies substrate isolation in localized regions.

Figure 1D:
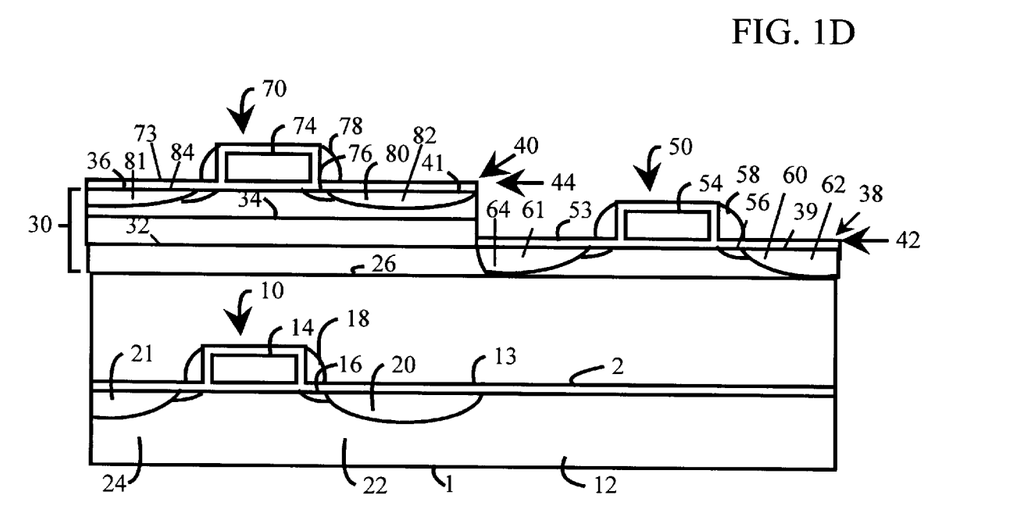

Referring to FIG. 1D, transistors are formed on the first elevated substrate region 38 and the second elevated substrate region 40. In particular, a second layer of transistors 42 is fabricated on the top surface 39 of the base polysilicon layer 32 in the first elevated substrate region 38. A third layer of transistors 44 is fabricated on the top surface 41 of the top polysilicon layer 36 in the second elevated substrate region 40.

Transistors in the first elevated substrate region 38 and the second elevated substrate region 40 are constructed using the same techniques for forming devices on the first transistor layer. For example, an LDD MOSFET 50 includes a gate oxide layer 53 overlying the base polysilicon layer 32, a polysilicon gate 54, and implanted LDD regions 56 in the base polysilicon layer 32 self-aligned with the polysilicon gate 54. Silicon nitride or silicon dioxide spacers 58 are formed lateral to the polysilicon gate 54. The MOSFET 50 also includes a heavily-doped drain implant 60 implanted on a drain side 62 of the MOSFET 50. A source side 64 of the MOSFET 50 is shown implanted with a heavily-doped source implant 61.

Similarly, an LDD MOSFET 70 includes a gate oxide layer 73 overlying the top polysilicon layer 36, a polysilicon gate 74, and implanted LDD regions 76 in the top polysilicon layer 36 self-aligned with the polysilicon gate 74. Silicon nitride or silicon dioxide spacers 78 are formed lateral to the polysilicon gate 74. The MOSFET 70 also includes a heavily-doped drain implant 80 implanted on a drain side 82 of the MOSFET 70. A source side 84 of the MOSFET 70 is shown implanted with a heavily-doped source implant 81.

The $SiO_2$ isolation layer 34 between the base polysilicon layer 32 and the top polysilicon layer 36 mutually and electrically isolates devices formed on the first elevated substrate region 30 and the second elevated substrate region 40.

Transistors in the upper layers, such as the LDD MOSFET 50 and other transistors (not shown) on the first elevated substrate region 30 and the LDD MOSFET 70 and other transistors (not shown) on the second elevated substrate region 40, may be mutually isolated by isolation doping (not shown) through the entire substrate thickness. Isolation doping is performed following formation of the transistors by masking and doping with the underlying $SiO_2$ isolation layer 34 also supplying isolation between transistors on the same substrate elevated level.

Figure 2A:
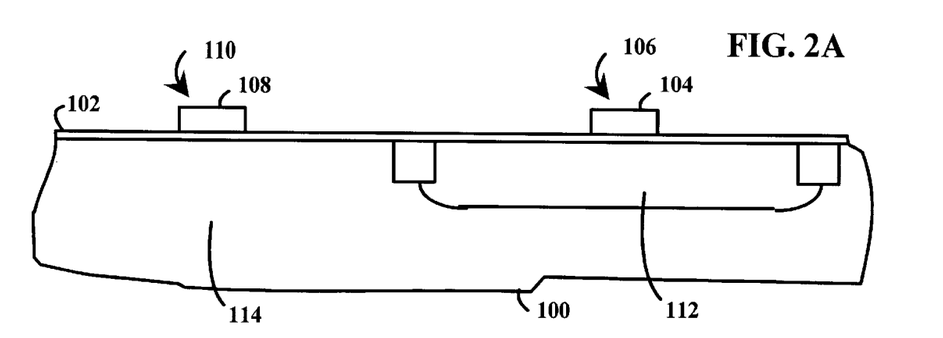
FIGS. 2A through 2J depict a sequence of schematic cross-sectional views of a silicon wafer during processing for forming an integrated circuit including transistors formed in a plurality of planes on substrates including an oxide-isolated substrate and a silicon substrate.

Referring to FIGS. 2A through 2J, a series of schematic cross-sectional views of a silicon wafer 100 illustrate a more detailed view of processing for forming an integrated circuit including transistors formed in a plurality of planes on substrates including an oxide-isolated substrate and a silicon substrate. Referring to FIG. 2A, an exemplary embodiment is shown in which NMOS devices in an N-well technology are formed in a lightly doped P-substrate having a P-type impurity concentration of greater than approximately $10^{15}/cm^3$ and PMOS devices are formed in a more heavily-doped N-type substrate having an impurity concentration of less than $10^{16}/cm^3$. The starting material is typically a heavily-doped <100> orientation silicon substrate having a quality suitable for integrated circuit manufacture.

The formation of transistors in a plurality of substrate layers substantially increases the density of an integrated circuit without appreciably increasing the thickness of a substrate wafer. The thickness of a substrate wafer is selected to be sufficient to withstand multiple diffusion processes without warping. For example, a typical eight inch silicon wafer 100 has a thickness of approximately 720 or 721 microns which is increased by epitaxial growth of a P+ substrate grown directly upon the silicon wafer 100, and further increases by epitaxial growth of a P- substrate overlying the P+ substrate. The P+ epitaxial growth is generally included for implementing functions such as latchup protection. Additional substrate is grown to a thickness generally in the range from 1 to 4 microns to form additional layers of transistors. For example, in the illustrative embodiment, a first elevated substrate is grown to a thickness in a range from approximately 500 Å to 4000 Å and a second elevated substrate is grown to a thickness also in the range from approximately 500 Å to 4000 Å. Note that the second elevated substrate layer may be deposited much thinner, to a range from approximately 250 Å to 300 Å, by doping the second elevated substrate layer through to an underlying oxide isolation layer.

A thin (5 μm to 10 μm) lightly-doped epitaxial layer is grown on the silicon substrate. The illustrative epitaxial layer is a P-type epitaxial surface layer with a <100> orientation and a resistivity of 12 ohm-cm. Either an n-epi-on-$n^+$ or a p-epi-on-$p^+$ substrate may be used for the epitaxial layer. The a p-epi-on-$p^+$ substrate is more typically used due to a lesser sensitivity to process-induced defects. The silicon substrate and the epitaxial layer in combination form a silicon wafer 100.

Ions are implanted into the silicon wafer 100 to adjust a threshold voltage $V_T$. In embodiments including a P-layer, an N-layer, or both a P-layer and an N-layer, the threshold voltage $V_T$ is adjusted by ion implantation for both enhancement mode and depletion mode transistors. Ion implantation is used to set threshold voltage $V_T$, advantageously allowing the threshold voltage $V_T$ to be set independently of substrate doping, allowing substrate doping to be set on the basis of device performance alone. Adjustment of threshold voltage $V_T$ is achieved by implanting impurities such as boron, phosphorus, or arsenic ions into regions beneath the gate oxide of a MOSFET. Boron atoms positively shift threshold voltage $V_T$. Phosphorus or arsenic atoms negatively shift threshold voltage $V_T$. The threshold voltage $V_T$ adjustment implant is performed either with a single boron implant or separate p-type and n-type implants using additional masking steps.

In the illustrative embodiment, threshold adjustment implants and punchthrough implants are implanted prior to growth of a gate-oxide layer on the silicon wafer 100 surface. In various embodiments, threshold adjustment implants and punchthrough implants may be performed either before or after formation of a trench or before or after gate-oxide growth. In conventional devices, the threshold voltage $V_T$ adjustment implant is injected through the gate oxide layer to limit depth of the boron threshold adjustment implant to a shallow depth. A suitable threshold voltage $V_T$-adjust implant energy forms an implant with a peak concentration at the oxide-silicon interface. A subsequent implant-activating anneal operation distributes the implanted ions more broadly than the implanted profile.

In an illustrative embodiment, a threshold voltage $V_T$ adjustment implant for enhancement-mode devices is performed. For example, boron is implanted at a concentration in a range from approximately $10^{12}$ to $10^{13}$ atoms/$cm^2$ and an energy in the range from about 10 keV to 100 keV, an energy insufficient to penetrate a trench or field oxide isolation (not shown). The $V_T$ adjustment implant for enhancement-mode devices is typically performed without masking.

A threshold voltage $V_T$ adjustment implant for depletion-mode devices is performed by implanting areas of depletion-mode devices with phosphorus or arsenic atoms at a concentration of about $10^{12}$ atoms/$cm^2$ and an implant energy in the range of about 100 keV. The implant dosage is adjusted to overcompensate for the boron threshold voltage $V_T$ adjustment implant for enhancement-mode devices. The depletion-mode implant is performed with a photoresist mask to selectively locate the depletion-mode transistor channels.

A layer of silicon dioxide with a thickness in the range of 30 Å to 150 Å forms a gate oxide layer 102 on the top surface of the silicon wafer 100 by tube growth at a temperature of 700° C. to 1000° C. in an $O_2$ ambient.

In the illustrative embodiment, a polysilicon gate 104 for a P-channel transistor 106 and a polysilicon gate 108 for an N-channel transistor 110 are formed by depositing a layer of undoped polysilicon to a thickness of approximately 2000 Å by low pressure chemical vapor deposition (LPCVD) over the gate oxide layer 102. The polysilicon is doped using a technique selected from among several suitable techniques including doping in situ during deposition and doping prior to etching by implanting arsenic atoms with a dosage in a range from $1 \times 10^{15}$ to $5 \times 10^{16}$ atoms/cm$^2$ and an energy in a range from 2 to 50 kiloelectron-volts (keV). In another example, polysilicon is doped in a subsequent process step during introduction of dopant into the silicon wafer 100. The polysilicon gates 104 and 108 are formed by depositing a photoresist mask (not shown) in a continuous layer over the polysilicon layer and irradiating the photoresist mask using a photolithographic system. The photolithographic system projects I-line ultraviolet light from a mercury-vapor lamp through a reticle and a focusing lens to form a predetermined image pattern on the photoresist mask. The photoresist mask is developed and irradiated portions are removed to form openings in the mask. An anisotropic dry etch etches the polysilicon layer to form the polysilicon gates 104 and 108 with substantially vertical side walls using an etching process that is highly selective of polysilicon. A reactive ion etch (RIE) removes the regions of gate oxide layer 102 except for portions underlying the polysilicon gates 104 and 108. The photoresist mask is stripped.

The polysilicon gate 104 of the P-channel transistor 106 overlies a region of N-doped substrate 112, such as an N-well. The polysilicon gate 108 of the N-channel transistor 110 overlies a region of P-doped substrate 114.

Figure 2B:
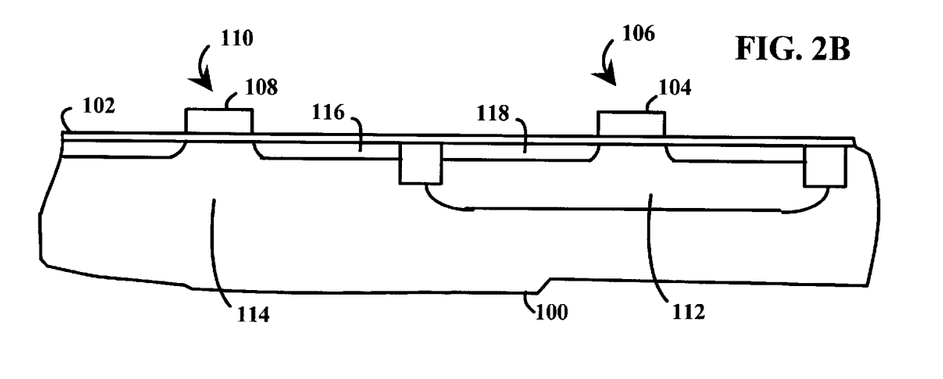

Referring to FIG. 2B, a first masking step and a first ion implant step form a N$^-$ LDD implant and include applying a lightly-doped drain (LDD) mask to the silicon wafer 100 and implanting N$^-$ ions to form N-channel transistor LDD regions 116 which are self-aligned with the polysilicon gate 100. The N$^-$ ion implantation process includes implanting arsenic at a dosage in the range of $1 \times 10^{13}$ to $5 \times 10^{14}$ atoms/cm$^2$ and an energy in the range of 2 to 50 keV, using the polysilicon gate 108 as an implant mask. A second masking step and a second ion implant step form a P$^-$ LDD implant and include applying a lightly-doped drain (LDD) mask to the silicon wafer 100 and implanting P$^-$ ions to form P-channel transistor LDD regions 118 which are self-aligned with the polysilicon gate 104. The P$^-$ ion implantation process includes implanting boron or BF$_2$ at a dosage in the range of $1 \times 10^{13}$ to $5 \times 10^{14}$ atoms/cm$^2$ and an energy in the range of 2 to 50 keV, using the polysilicon gate 104 as an implant mask. The implant energy for a boron implant is typically much lower than the implant energy for the BF$_2$ since boron atoms are very light and implant too deeply at high energies.

Figure 2C:
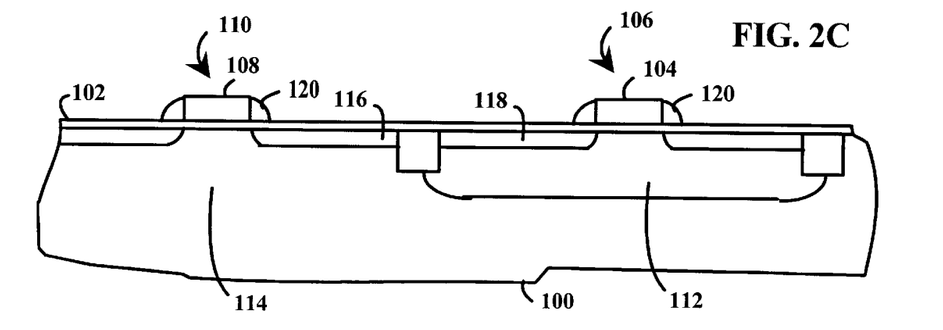

Referring to FIG. 2C, silicon nitride or silicon dioxide spacers 120 are formed on the substantially vertical side walls of the P-channel polysilicon gate 104 and the N-channel polysilicon gate 108. In one embodiment, silicon nitride spacers 120 are formed by chemical vapor deposition of a silicon nitride (Si$_3$N$_4$) film overlying the silicon wafer 100 and polysilicon gates 104 and 108. Silicon nitride films are amorphous insulating materials that serve as passivation and mechanical protective layers for integrated circuits. Silicon nitride films are suitable for usage as a passivation layer by acting as a nearly impervious barrier to diffusion, particularly diffusion of moisture and sodium.

A silicon nitride film is deposited using several techniques. In one technique, silicon nitride is deposited by high-temperature (700° C. to 800° C.) low pressure chemical vapor deposition (LPCVD) to produce a silicon nitride film with good uniformity. In a second technique, silicon nitride is deposited by a low temperature (200° C. to 400° C.) plasma-enhanced chemical vapor deposition (PECVD) that is compatible with low-melting-point metals such as aluminum. The silicon nitride layer is conformally deposited to a thickness in a range from 600 Å to 2000 Å and etched using a reactive ion etch (RIE) procedure that forms the spacers 120 adjacent to the edges of the polysilicon gates 104 and 108.

In the illustrative embodiment, the spacers 120 are formed directly in contact with the polysilicon gates 104 and 108 and directly in contact with the silicon wafer 100. In alternative embodiments, the spacers 120 may be formed separated from the polysilicon gates 104 and 108 by a thin oxide layer and separated from the silicon wafer 100 by a thin oxide layer.

The form of the P-channel transistor LDD regions 118 and the N-channel transistor LDD regions A 116 determines the hot carrier performance of the transistors and is established by the profile of the spacers 120. For embodiments utilizing silicon nitride spacers 120, the spacer profile varies as a function of the spacer nitride etch time and the spacer nitride thickness. A suitable amount of over-etch is used to form the silicon nitride spacers 120. However, excessive over-etching reduces the width and height of the silicon nitride spacers 120 and causes gouging into the silicon of the silicon wafer 100. Control of the over-etch process becomes more difficult as the deposited spacer nitride layer thickness increases.

In alternative embodiments, materials other than silicon nitride may be employed as spacers on the gate electrodes. Advantages are gained by using a spacer material that is resistant to processes for etching a silicon dioxide (oxide) layer.

Figure 2D:
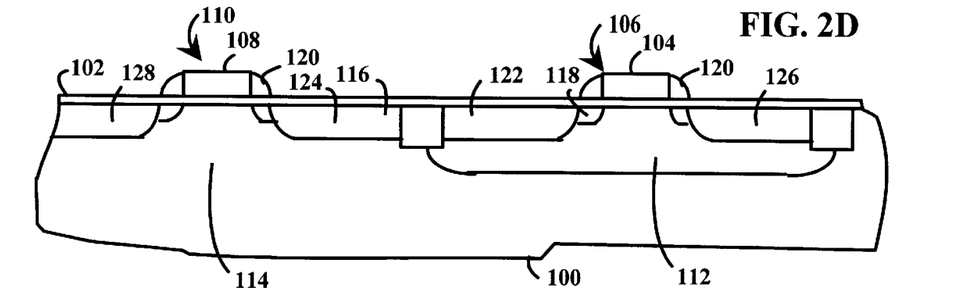

Referring to FIG. 2D, heavily doped drain regions including a P-channel drain region 122 and an N-channel drain region 124 and heavily doped source regions including a P-channel source region 126 and an N-channel source region 128 are implanted into the silicon wafer 100 by applying separate mask and implant processes for the P-channel transistor 106 and the N-channel transistor 100. The heavily-doped P-channel drain region 122 and heavily-doped P-channel source region 126 are implanted by injecting boron atoms or BF$_2$ molecules into a portion of the surface of the silicon wafer 100 that is self-aligned with the polysilicon gate 104, and the silicon nitride spacer 120 on the drain side and source side of the P-channel transistor 106, respectively. The boron atoms or BF$_2$ molecules are implanted at a dosage in the range of $1 \times 10^{15}$ to $5 \times 10^{15}$ atoms/cm$^2$ and an energy in the range of 10 KeV to 80 KeV to produce a boron or BF$_2$ concentration in the range of about $1 \times 10^{18}$ to $1 \times 10^{19}$ atoms/cm$^3$ and a junction depth in the range of 200 Å to 3000 Å. Generally, a typical source/drain P+ ion implant process is a shallow implant and therefore utilizes an implantation of BF$_2$ ions rather than boron ions. Boron ions are very light ions and a very low energy must be used to provide a shallow boron ion implant. If too high an energy is used, the light ions are implanted at too great a depth. However, when the implanting energy is low, the beam current is also too low so that the time taken to perform the implant is excessive. BF$_2$ ions are larger and heavier ions so that a higher energy implant achieves a shallow depth.

The heavily-doped N-channel drain region 124 and the N-channel source region 128 are implanted by injecting arsenic atoms into a portion of the surface of the silicon wafer 100 that is self-aligned with the polysilicon gate 108 and the silicon nitride spacer 120 on the drain side and the source side of the N-channel transistor 110, respectively. The arsenic atoms are implanted at a dosage in the range of $1 \times 10^{15}$ to $5 \times 10^{15}$ atoms/cm$^2$ and an energy in the range of 2 to 50 keV to produce an arsenic concentration in the range of about $1 \times 10^{18}$ to $1 \times 10^{19}$ atoms/cm$^3$ and a junction depth in the range of 200 Å to 3000 Å.

The junction depth of the P-channel drain region 122, the P-channel source region 126, the N-channel drain region 124, and the N-channel source region 128 is deeper than the depth of respective P-channel transistor LDD regions 118 and N-channel transistor LDD regions 116. The dopant concentration of the P-channel drain region 122 and the N-channel drain region 124 are sufficiently large to attain a conductive state of the respective P-channel polysilicon gate 104 and N-channel polysilicon gate 108 when connected to a suitably doped source.

The silicon wafer 100 is annealed to remove crystalline damage and activate and drive-in the implanted arsenic using a rapid thermal anneal process at a temperature in a range from 950° C. to 1050° C. for 10 to 60 seconds. The implanted boron or BF$_2$ in the silicon wafer 100 diffuses laterally and vertically, merging the P-channel drain region 122 with the P-channel transistor LDD region 118 in the vicinity of the P-channel drain region 122. The implanted arsenic in the silicon wafer 100 diffuses laterally and vertically to merge the N-channel drain region 124 with the N-channel transistor LDD regions 116 in the vicinity of the N-channel drain region 124.

Figure 2E:
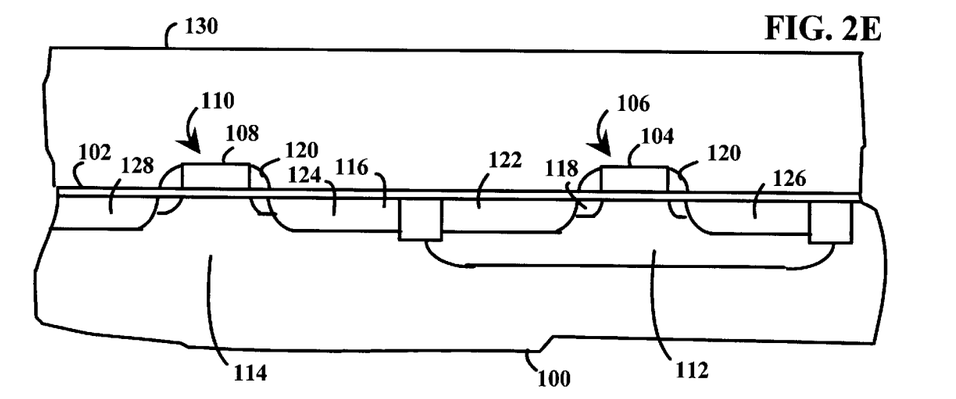

Referring to FIG. 2E, a blanket intralayer dielectric (ILD) layer of silicon dioxide (SiO$_2$) 130 is formed over the silicon wafer 100, covering the polysilicon gate 104 and spacers 120 of the P-channel transistor 106 and the polysilicon gate 108 and spacers 120 of the N-channel transistor 110. The ILD oxide layer 130 with a thickness in the range of 1000 Å to 25000 Å is conformally deposited over the silicon wafer 100 by chemical vapor deposition (CVD) at a temperature in the range of 300° C. to 400° C. The thick ILD layer of silicon dioxide 130 is planarized, for example by chemical-mechanical polishing or by reflow. The ILD layer of silicon dioxide 130 mutually isolates devices including the P-channel transistor 106 and the N-channel transistor 110 on the surface of the silicon wafer 100 and isolates devices from overlying conductive layers.

Figure 2F:
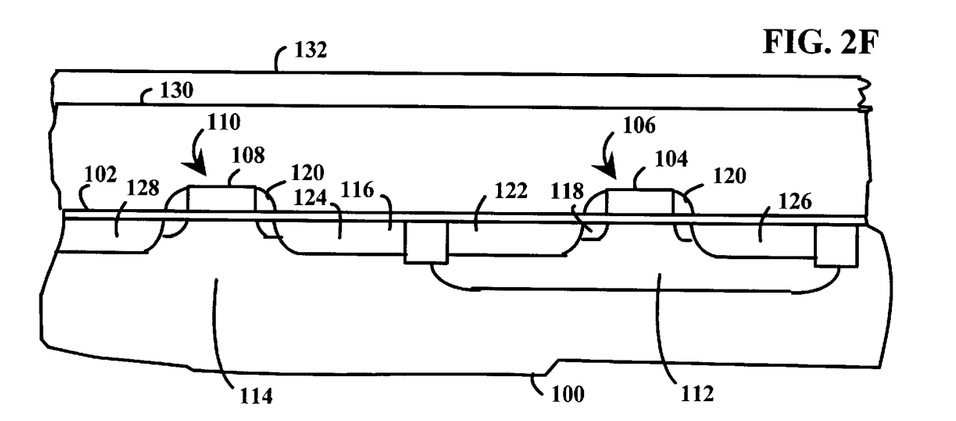

Referring to FIG. 2F, a blanket layer of polysilicon is deposited overlying the intralayer dielectric (ILD) layer of silicon dioxide 130 over the silicon wafer 100 to form a first-elevated-level polysilicon layer 132. The first-elevated-level polysilicon layer 132 is deposited by low pressure chemical vapor deposition (LPCVD) on the top surface of the oxide layer 130 to a selected thickness generally in a range from approximately 500 Å to 4000 Å.

The first-elevated-level polysilicon layer 132 is generally deposited by pyrolysis, thermal decomposition of silane (SiH$_4$), in a selected temperature range above 580° C. and typically in a range from approximately 580° C. to 650° C. The most typical technique for depositing polysilicon is LPCVD on the basis of the uniformity and purity of the deposited polysilicon and economy of the process. In one embodiment, polysilicon is deposited using an LPCVD system by a process in which 100% silane is applied at total pressures ranging from 0.3–1 torr. Other process embodiments are also viable. For example, 25% silane may be applied with a nitrogen carrier at total pressures from 0.3–1 torr. Another exemplary process utilizes a vertical flow isothermal reactor configuration, applying 25% silane diluted in hydrogen at approximately 1 torr pressure.

The first-elevated-level polysilicon layer 132 may be doped with N-type dopants or P-type dopants. Typically the first-elevated-level polysilicon layer 132 is doped by either an implant operation or by doping during deposition using a dopant species and dosages that are selected to enhance transistor performance. The polysilicon layer is annealed and then planarized.

Figure 2G:
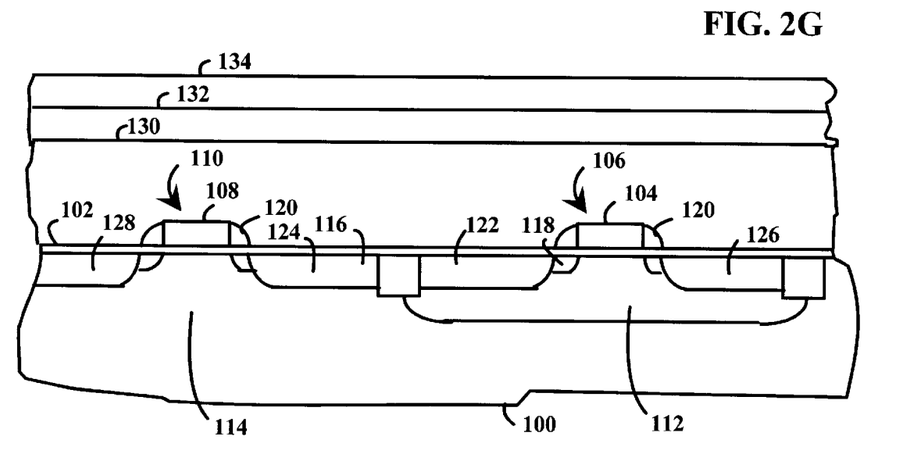

Referring to FIG. 2G, a SiO$_2$ isolation layer 134 is formed overlying the first-elevated-level polysilicon layer 132. The SiO$_2$ isolation layer 134 with a thickness in the range from approximately 500 Å to about 2000 Å is conformally deposited over the first-elevated-level polysilicon layer 132 by chemical vapor deposition (CVD) at a temperature in the range of 300° C. to 400° C. The SiO$_2$ isolation layer 134 is planarized, for example by chemical-mechanical polishing or by reflow. The SiO$_2$ isolation layer 134 mutually isolates devices including the P-channel transistor 106 and the N-channel transistor 110 on the surface of the silicon wafer 100 and isolates devices from overlying conductive layers.

Figure 2H:
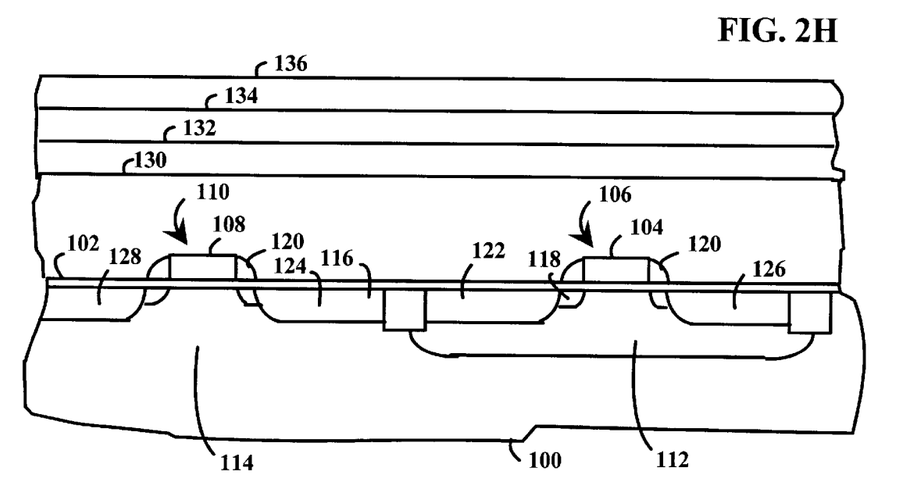

Referring to FIG. 2H, a blanket layer of polysilicon is deposited overlying the SiO$_2$ isolation layer 134 over the silicon wafer 100 to form a second-elevated-level polysilicon layer 136. The second-elevated-level polysilicon layer 136 is deposited by low pressure chemical vapor deposition (LPCVD) on the top surface of the SiO$_2$ isolation layer 134 to a selected thickness generally in a range from approximately 500 Å to 4000 Å. Like the first-elevated-level polysilicon layer 132, the second-elevated-level polysilicon layer 136 is deposited by pyrolysis, thermal decomposition of silane (SiH$_4$), in a selected temperature range above 580° C. and typically in a range from approximately 580° C. to 650° C. In other embodiments, other deposition gases may be used including, for example, silicon tetrachloride (SiCl$_4$), dichlorosilane (SiH$_2$Cl$_2$), or trichlorosilane (SiHCl$_3$). Generally, any gas having a silicon source is suitable for deposition although particular gases do have superior deposition characteristics at feasible temperature ranges. In particular, silane is generally an advantageous deposition gas by virtue of a high deposition rate at a relatively low temperature.

Similarly, other deposition techniques may be employed in place of low-pressure chemical vapor deposition (LPCVD), such as plasma-enhanced chemical vapor deposition (PECVD), sputtered silicon, and the like.

The second-elevated-level polysilicon layer 136 may be doped with N-type dopants or P-type dopants. Doping of the second-elevated-level polysilicon layer 136, in combination with electrical isolation achieved using the SiO$_2$ isolation layer 134, allows the thickness of the deposited polysilicon to be greatly reduced. For example, doping allows the polysilicon thickness to be reduced to a range of from 300 Å to 500 Å, advantageously allowing a more compact circuit, higher operating speeds, and reduced power losses. The second-elevated-level polysilicon layer 136 is doped by either an implant operation or by doping during deposition using a dopant species and dosages that are selected to enhance transistor performance. The polysilicon layer is annealed and then planarized.

Figure 2I:
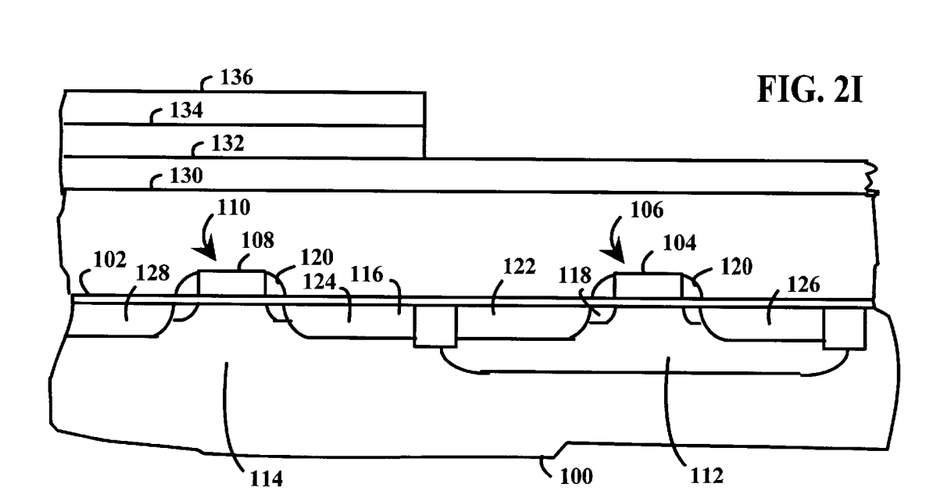

Referring to FIG. 2I, a pattern is formed using a localized oxide isolation mask over the surface of the second-elevated-level polysilicon layer 136 and the secondelevated-level polysilicon layer 136 and SiO$_2$ isolation layer 134 are etched. The localized oxide isolation mask supplies a pattern for etching the second-elevated-level polysilicon layer 136 and the SiO$_2$ isolation layer 134. Using the localized oxide isolation mask, the SiO$_2$ isolation layer 134 is selectively formed in one configuration of a variety of configurations.

A doped region is often formed in a substrate and one or more transistors may make a suitable connection to the doped region which may, in turn, be connected with a selected voltage level. The SiO$_2$ isolation layer 134 is selectively etched so that suitable connections are made from the transistors to the doped regions. For example, a P+ doped region may be formed to serve as a wall tie or P wall for connecting to a ground voltage level. A plurality of transistors are connected to ground by a suitable configuration of the SiO$_2$ isolation layer 134 so that connections are made between the transistors and the P+ doped region. The SiO$_2$ isolation layer 134 prevents connections of transistors that are not intended to be connected to ground.

The localized oxide isolation mask may further include masking to form a pattern for etching into the second-elevated-level polysilicon layer 136, for example to isolate transistors on the second-elevated-level polysilicon layer 136 from transistors formed on the silicon wafer 100.

Figure 2J:
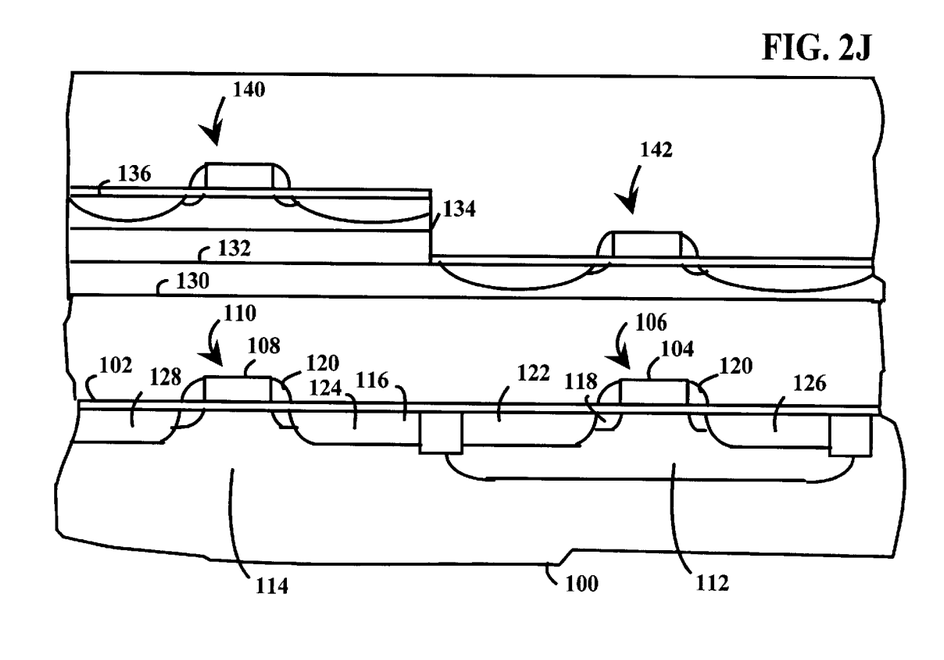

Referring to FIG. 2J, a transistor 140 is fabricated on the first-elevated-level polysilicon layer 132 and a transistor 142 is fabricated on the second-elevated-level polysilicon layer 136 are formed using fabrication techniques generally similar to the processes discussed previously with reference to FIGS. 2A through 2D.

In various embodiments, transistors may be positioned in any desired location. Generally a transistor fabricated on the silicon wafer 100 such as P-channel transistor 106 and a polysilicon gate 108 for an N-channel transistor 110. However, transistors such as transistors 140 and 142 are optionally positioned on the first-elevated-level polysilicon layer 132 and the second-elevated-level polysilicon layer 136 according to the functionality of the integrated circuit.

Figure 3:
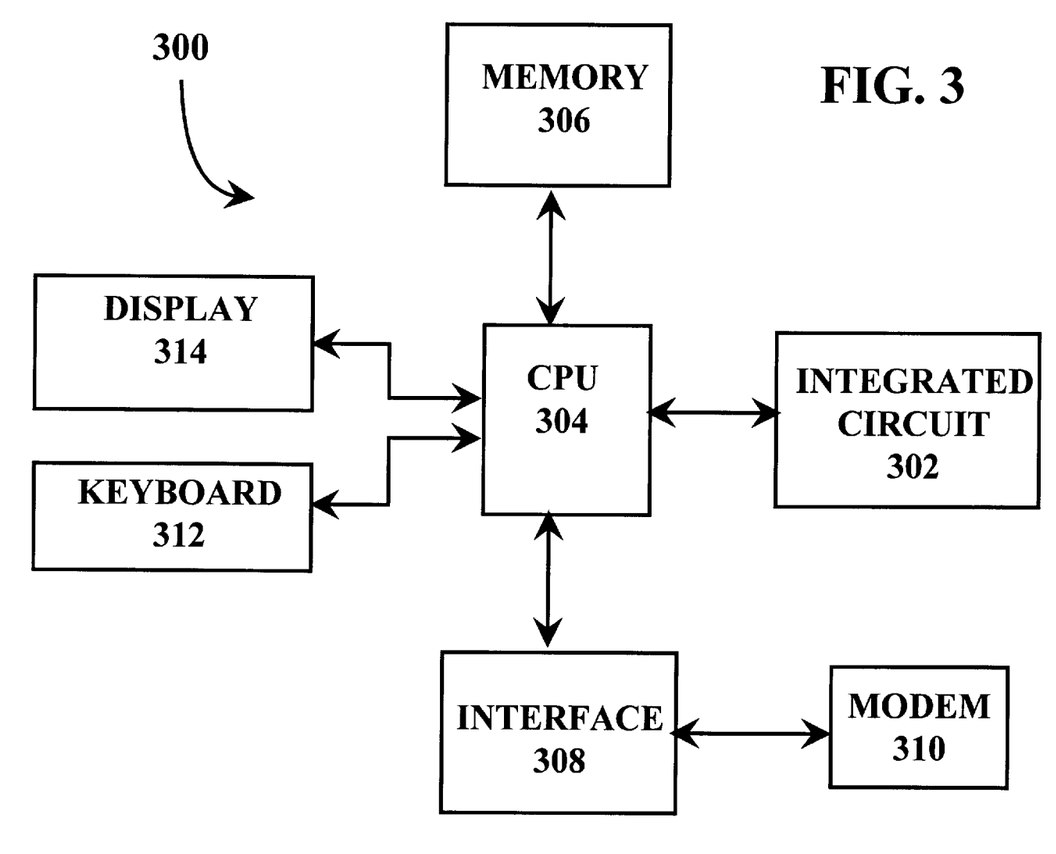
FIG. 3 is a schematic block diagram illustrating a computer system including an integrated circuit including transistors formed in a plurality of planes on substrates including an oxide-isolated substrate and a silicon substrate fabricated using a method depicted in FIGS. 1A through 1C, and FIGS. 2A through 2J.

Referring to FIG. 3, a computer system 300 includes an integrated circuit 302, a central processing unit 304, a memory 306, and an interface 308, connected to a modem 310. The computer system 300 also includes a keyboard 312 and a display 314 forming a user interface.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. An integrated circuit comprising:
   a substrate wafer;
   a transistor formed on the substrate wafer in a first transistor plane;
   an intralayer dielectric (ILD) layer overlying the substrate and the transistor;
   a first-elevated-level polysilicon layer overlying the ILD layer;
   an oxide isolation layer overlying the an overlaid portion of the first-elevated-level polysilicon layer;
   a second-elevated-level polysilicon layer overlying the oxide isolation layer in the region of the overlaid portion of the first-elevated-level polysilicon layer, the remaining portion of the first-elevated-level polysilicon layer being an exposed portion;
   a first-elevated-level transistor on the exposed portion of the first-elevated-level polysilicon layer: and
   a second-elevated-level transistor laterally adjacent to the first-elevated-level transistor on the second-elevated-level polysilicon layer.

2. An integrated circuit according to claim 1, wherein a transistor formed on the substrate further comprises:
   a gate oxide layer formed on the substrate;
   a gate formed on the substrate overlying the gate oxide layer; and
   source and drain regions implanted into the substrate, self-aligned with respect to the gate.

3. An integrated circuit according to claim 1, wherein a transistor formed on an elevated level of the first and second elevated levels further comprises:
   a gate oxide layer formed on a polysilicon layer;
   a gate formed on the polysilicon layer overlying the gate oxide layer; and
   source and drain regions implanted into the polysilicon layer self-aligned with respect to the gate.

4. An integrated circuit according to claim 1, wherein:
   the first-elevated-level polysilicon layer has a thickness of approximately 500 Å to approximately 4000 Å;
   the oxide isolation layer has a thickness of approximately 500 Å to approximately 2000 Å; and
   the second-elevated-level polysilicon layer has a thickness of approximately 500 Å to approximately 4000 Å.

5. An integrated circuit according to claim 1, wherein:
   the first-elevated-level polysilicon layer has a thickness of approximately 500 Å to approximately 4000 Å;
   the oxide isolation layer has a thickness of approximately 500 Å to approximately 2000 Å; and
   the second-elevated-level polysilicon layer has a thickness of approximately 300 Å to approximately 500 Å, the second-elevated-level polysilicon layer being doped throughout the thickness to the oxide isolation layer.

6. An integrated circuit according to claim 1 wherein:
   the oxide isolation layer includes a localized oxide isolation mask in a configuration determined by the existing and planned position of transistors on the substrate, the first-elevated-level polysilicon layer, and the second-elevated-level polysilicon layer, the localized oxide isolation mask isolating individual transistors.

7. An integrated circuit according to claim 1 wherein:
   the oxide isolation layer includes a localized oxide isolation mask in a configuration determined by the existing and planned position of transistors on the substrate, the first-elevated-level polysilicon layer, and the second-elevated-level polysilicon layer, the localized oxide isolation mask isolating groups of transistors.

8. An integrated circuit according to claim 1 wherein:
   the transistor on the substrate is a first-type transistor; and
   the first-elevated-level transistor on the first-elevated-level polysilicon layer is a second-type transistor of a type complementary to the first-type transistor.

9. An integrated circuit comprising:

a substrate wafer;

a transistor formed on the substrate wafer in a base transistor plane;

an intralayer dielectric (ILD) layer; and a plurality of elevated transistor planes, the elevated transistor planes including:

a first-elevated-level polysilicon layer overlying the ILD layer;

an oxide isolation layer overlying the an overlaid portion of the first-elevated-level polysilicon layer;

a second-elevated-level polysilicon layer overlying the oxide isolation layer in the region of the overlaid portion of the first-elevated-level polysilicon layer, the remaining portion of the first-elevated-level polysilicon layer being an exposed portion;

a first-elevated-level transistor on the exposed portion of the first-elevated-level polysilicon layer; and a second-elevated-level transistor laterally adjacent to the first-elevated-level transistor on the second-elevated-level polysilicon layer.

10. An integrated circuit according to claim 9, wherein a transistor formed on the substrate further comprises:

a gate oxide layer formed on the substrate;

a gate formed on the substrate overlying the gate oxide layer; and source and drain regions implanted into the substrate self-aligned with respect to the gate.

11. An integrated circuit according to claim 9, wherein a transistor formed on an elevated level of the first and second elevated levels further comprises:

a gate oxide layer formed on a polysilicon layer;

a gate formed on the polysilicon layer overlying the gate oxide layer; and source and drain regions implanted into the polysilicon layer self-aligned with respect to the gate.

12. An integrated circuit according to claim 9, wherein:

the first-elevated-level polysilicon layer has a thickness of approximately 500 Å to approximately 4000 Å;

the oxide isolation layer has a thickness of approximately 500 Å to approximately 2000 Å; and the second-elevated-level polysilicon layer has a thickness of approximately 500 Å to approximately 4000 Å.

13. An integrated circuit according to claim 9, wherein:

the first-elevated-level polysilicon layer has a thickness of approximately 500 Å to approximately 4000 Å;

the oxide isolation layer has a thickness of approximately 500 Å to approximately 2000 Å; and the second-elevated-level polysilicon layer has a thickness of approximately 300 Å to approximately 500 Å, the second-elevated-level polysilicon layer being doped throughout the thickness to the oxide isolation layer.

14. An integrated circuit according to claim 9 wherein:

the oxide isolation layer includes a localized oxide isolation mask in a configuration determined by the existing and planned position of transistors on the substrate, the first-elevated-level polysilicon layer, and the second-elevated-level polysilicon layer, the localized oxide isolation mask isolating individual transistors.

15. An integrated circuit according to claim 9 wherein:

the oxide isolation layer includes a localized oxide isolation mask in a configuration determined by the existing and planned position of transistors on the substrate, the first-elevated-level polysilicon layer, and the second-elevated-level polysilicon layer, the localized oxide isolation mask isolating groups of transistors.

16. An integrated circuit according to claim 9 wherein:

the transistor on the substrate is a first-type transistor; and the first-elevated-level transistor on the first-elevated-level polysilicon layer is a second-type transistor of a type complementary to the first-type transistor.

17. An integrated circuit chip including an integrated circuit formed using a method of fabricating an integrated circuit comprising:

forming a transistor on a substrate;

forming an intralayer dielectric (ILD) layer overlying the substrate and the transistor;

depositing a first-elevated-level polysilicon layer overlying the ILD layer;

depositing an oxide isolation layer overlying the first-elevated-level polysilicon layer;

depositing a second-elevated-level polysilicon layer overlying the oxide isolation layer;

patterning and etching the second-elevated-level polysilicon layer and the oxide isolation layer using an oxide isolated localized substrate mask to expose a portion of the first-elevated-level polysilicon layer at a first elevated level, leaving a remaining portion of the first-elevated-level polysilicon layer underlying a remaining portion of the oxide isolation layer and a remaining portion of the second-elevated-level polysilicon layer exposed at a second elevated level; and forming a first-elevated-level transistor on the exposed portion of the first-elevated-level polysilicon layer and forming a second-elevated-level transistor laterally adjacent to the first-elevated-level transistor on the second-elevated-level polysilicon layer.

18. An integrated circuit chip according to claim 17 formed using a method of fabrication further comprising:

patterning and etching the polysilicon layer and the oxide isolation layer using a localized oxide isolation mask in a configuration determined by the existing and planned position of transistors on the substrate, the first-elevated-level polysilicon layer, and the second-elevated-level polysilicon layer, the localized oxide isolation mask isolating individual transistors.

19. An integrated circuit chip according to claim 17 formed using a method of fabrication further comprising:

patterning and etching the polysilicon layer and the oxide isolation layer using a localized oxide isolation mask in a configuration determined by the existing and planned position of transistors on the substrate, the first-elevated-level polysilicon layer, and the second-elevated-level polysilicon layer, the localized oxide isolation mask isolating groups of transistors.

20. An integrated circuit chip according to claim 17 formed using a method of fabrication further comprising:

forming the transistor on the substrate of a first type;

forming the first-elevated-level transistor on the first-elevated-level polysilicon layer of a second type, complementary to the first type.

21. An electronic system including a microprocessor, a memory, a system bus and an integrated circuit fabricated using a method of fabricating an integrated circuit comprising:

forming a transistor on a substrate;

forming an intralayer dielectric (ILD) layer overlying the substrate and the transistor;

depositing a first-elevated-level polysilicon layer overlying the ILD layer;

depositing an oxide isolation layer overlying the first-elevated-level polysilicon layer;

depositing a second-elevated-level polysilicon layer overlying the oxide isolation layer;

patterning and etching the second-elevated-level polysilicon layer and the oxide isolation layer using an oxide isolated localized substrate mask to expose a portion of the first-elevated-level polysilicon layer at a first elevated level, leaving a remaining portion of the first-elevated-level polysilicon layer underlying a remaining portion of the oxide isolation layer and a remaining portion of the second-elevated-level polysilicon layer exposed at a second elevated level; and forming a first-elevated-level transistor on the exposed portion of the first-elevated-level polysilicon layer and forming a second-elevated-level transistor laterally adjacent to the first-elevated-level transistor on the second-elevated-level polysilicon layer.

* * * * *